US010224248B2

(12) United States Patent
Zhou

(10) Patent No.: US 10,224,248 B2
(45) Date of Patent: Mar. 5, 2019

(54) SEMICONDUCTOR STRUCTURE AND FABRICATING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 4 days.

(21) Appl. No.: 15/284,839

(22) Filed: Oct. 4, 2016

(65) Prior Publication Data
US 2017/0117188 A1    Apr. 27, 2017

(30) Foreign Application Priority Data
Oct. 22, 2015 (CN) .......................... 2015 1 0690768

(51) Int. Cl.
H01L 21/306 (2006.01)
H01L 21/8238 (2006.01)
(Continued)

(52) U.S. Cl.
CPC .... *H01L 21/823807* (2013.01); *H01L 21/265* (2013.01); *H01L 21/30604* (2013.01);
(Continued)

(58) Field of Classification Search
CPC .......... H01L 21/823807; H01L 21/265; H01L 21/324; H01L 21/823821; H01L 21/30604;
(Continued)

(56) References Cited

U.S. PATENT DOCUMENTS 6,951,784 B1 * 10/2005 Anderson ......... H01L 29/66795
438/157
8,497,171 B1    7/2013 Wu
(Continued)

FOREIGN PATENT DOCUMENTS

CN         103107139 A     5/2013

OTHER PUBLICATIONS

Takahashi, Keisuke, FinFETs with Both Large Body Factor and High Drive-Current, Semiconductor Device Research Symposium, 2007 International, IEEE, Dec. 12-14, 2007, 2 Pages, College Park, MD, USA.

*Primary Examiner* — Caridad Everhart
(74) *Attorney, Agent, or Firm* — Anova Law Group, PLLC

(57) ABSTRACT

In various embodiments of the disclosed subject matter, a semiconductor structure, and a fabricating method thereof are provided. The method for forming a semiconductor structure comprises: providing a substrate; implanting first punch-through preventing ions into an NMOS region of the substrate to form a first implantation layer; implanting second punch-through preventing ions into a PMOS region of the substrate to form a second implantation layer; etching the substrate to form first fin portions in the NMOS region, and second fin portions in the PMOS region, the remaining first implantation layer forms a first punch-through preventing layer, the remaining second implantation layer forms a second punch-through preventing layer; forming insulating structures between adjacent first fin portions and second fin
(Continued)

portions; and performing an annealing process to activate the first punch-through preventing layer and the second punch-through preventing layer.

19 Claims, 9 Drawing Sheets

(51) Int. Cl.
    *H01L 29/66*     (2006.01)
    *H01L 27/092*     (2006.01)
    *H01L 21/265*     (2006.01)
    *H01L 21/324*     (2006.01)

(52) U.S. Cl.
    CPC .... *H01L 21/324* (2013.01); *H01L 21/823821* (2013.01); *H01L 21/823857* (2013.01); *H01L 27/0924* (2013.01); *H01L 29/66803* (2013.01)

(58) Field of Classification Search
    CPC ......... H01L 21/823857; H01L 27/0928; H01L 27/0921; H01L 29/66803
    See application file for complete search history.

(56) References Cited

U.S. PATENT DOCUMENTS

| | | | |
|---|---|---|---|
| 8,610,201 | B1 | 12/2013 | Hokazono |
| 9,082,698 | B1 | 7/2015 | Joshi et al. |
| 9,275,905 | B1* | 3/2016 | Wen ...................... H01L 21/845 |
| 2009/0267155 | A1 | 10/2009 | Izumida et al. |
| 2013/0230953 | A1 | 9/2013 | Sudo |
| 2014/0054679 | A1* | 2/2014 | Tang ................. H01L 21/26586 257/329 |
| 2014/0252475 | A1* | 9/2014 | Xu ........................ H01L 29/785 257/347 |
| 2014/0264485 | A1* | 9/2014 | Li ................... H01L 21/823431 257/288 |
| 2014/0312393 | A1 | 10/2014 | Rodder et al. |
| 2014/0346612 | A1 | 11/2014 | Adam et al. |
| 2015/0255557 | A1 | 9/2015 | Zhu et al. |
| 2015/0294879 | A1 | 10/2015 | Zhu et al. |
| 2016/0268260 | A1* | 9/2016 | Lim ..................... H01L 27/0924 |
| 2017/0047425 | A1* | 2/2017 | Bentley ............ H01L 29/66537 |
| 2018/0005841 | A1* | 1/2018 | Farmer ............... H01L 21/3065 |

* cited by examiner

SEMICONDUCTOR STRUCTURE AND FABRICATING METHOD THEREOF

CROSS-REFERENCES TO RELATED APPLICATIONS

This application claims the priority of Chinese patent application No. 201510690768.0, filed on Oct. 22, 2015, the entire content of which is incorporated herein by reference.

TECHNICAL FIELD

The present disclosure generally relates to the field of semiconductor technologies and, more particularly, relates to a semiconductor structure, and a fabricating method thereof.

BACKGROUND

With the rapid development of semiconductor manufacturing technology, semiconductor devices have been developed for higher component density and higher degree of integration. Transistors, as the basic semiconductor devices, are currently being widely used. With the improvement of the component density and integration degree of the semiconductor devices, the gate sizes of planar transistors are getting shorter. Thus the traditional planar transistors may have a weakened control ability to the channel current, resulting in short-channel effects which can generate leakage current. Ultimately, electrical properties of the semiconductor devices can be affected.

In order to overcome the short channel effect and to eliminate the transistor leakage current, the fin field-effect transistor (Fin FET) is proposed. Fin FET is a common multi-gate devices. The structure of a Fin FET can include: a fin portion on the surface of a semiconductor substrate, a dielectric layer covering the surface of the semiconductor substrate and a part of the sidewalls of the fin portion, a gate structure on the surfaces of the dielectric layer as well as the top and sidewalls of the fin portion, and a source region and a drain region that are located in the fin portion on two sides of the gate structure.

However, as the dimensions of semiconductor devices continually decrease, the Fin FET manufacturing process has been challenged. It is difficult to ensure a stable performance of the Fin FET.

BRIEF SUMMARY

In accordance with some embodiments of the disclosed subject matter, a semiconductor structure, and a fabricating method thereof are provided.

One aspect of the disclosed subject matter provides a method for forming a semiconductor structure, comprising: providing a substrate including an NMOS region and a PMOS region that are adjacent to each other; implanting first punch-through preventing ions into the NMOS region of the substrate to form a first implantation layer; implanting second punch-through preventing ions into the PMOS region of the substrate to form a second implantation layer; etching the substrate to form a plurality of fin portions, including first fin portions in the NMOS region, and second fin portions in the PMOS region, wherein: surfaces of the substrate between the first fin portions in the NMOS region are lower than the first implantation layer, the remaining first implantation layer in the first fin portions that is not etched forms a first punch-through preventing layer, surfaces of the substrate between the second fin portions in the PMOS region are lower than the second implantation layer, and the remaining second implantation layer in the second fin portions that is not etched forms a second punch-through preventing layer; forming insulating structures between adjacent first fin portions and second fin portions, wherein surfaces of the insulating structures are higher than top surfaces of the first punch-through preventing layer and the second punch-through preventing layer; and performing an annealing process to activate the first punch-through preventing layer and the second punch-through preventing layer.

In some embodiments, the first punch-through preventing ions are P-type ions including fluoride ions, or boron difluoride; and the second punch-through preventing ions are N-type ions including arsenic ions.

In some embodiments, after performing the annealing process, a doping concentration of the first punch-through preventing ions in the first punch-through preventing layer is in a range from $1.0E18$ atom/cm$^3$ to $5.0E19$ atom/cm$^3$, and a doping concentration of the second punch-through preventing ions in the second punch-through preventing layer is in a range from $1.0E18$ atom/cm$^3$ to $5.0E19$ atom/cm$^3$.

In some embodiments, the method further comprises: after forming the insulating structure and before performing the annealing process, implanting diffusion preventing ions into insulating structure in the NMOS region, and making the diffusion preventing ions enter the first punch-through preventing layer to prevent a diffusion of the first punch-through preventing ions; wherein after performing the annealing process, a doping concentration of the diffusion ions in the first punch-through preventing layer is in a range from $1.0E19$ atom/cm$^3$ to $5.0E20$ atom/cm$^3$.

In some embodiments, the diffusion preventing ions include carbon ions and nitrogen ions, and are implanted into insulating structure in the NMOS region by using a composite ions implantation process.

In some embodiments, the diffusion preventing ions are implanted into insulating structure in the NMOS region by using a lateral straggle ion implantation process.

In some embodiments, forming the insulating structure comprises:
forming an insulating material layer, a top surface of the insulating layer is non-lower than the top surfaces of the fin portions; and etching the insulating material layer to make the top surface of the insulating layer lower than the top surfaces of the fin portions to form the insulating structure.

In some embodiments, the insulating material layer is formed by using a flowable chemical vapor deposition process, including: forming a precursor layer, a surface of the precursor layer is non-lower than the top surfaces of the fin portions; and curing the precursor layer to form the insulating material layer by using a low-temperature annealing process, wherein a temperature of the low-temperature annealing process is in a range from 500° C. to 600° C., a duration time of the low-temperature annealing process is in a range from 20 minutes to 40 minutes.

In some embodiments, the method further comprises: after performing the annealing process, forming a first threshold voltage adjusting layer in the first fin portions, and a second threshold voltage adjusting layer in the second fin portions; wherein the first threshold voltage adjusting layer is located just above the first punch-through preventing layer, the second threshold voltage adjusting layer is located just above the second punch-through preventing layer.

Another aspect of the disclosed subject matter provides another method for forming a semiconductor structure, comprising: providing a substrate including an NMOS region and a PMOS region that are adjacent to each other; implanting first punch-through preventing ions into the NMOS region of the substrate to form a first implantation layer; etching the substrate to form a plurality of fin portions, including first fin portions in the NMOS region, and second fin portions in the PMOS region, wherein: surfaces of the substrate between the first fin portions in the NMOS region are lower than the first implantation layer, and the remaining first implantation layer in the first fin portions that is not etched forms a first punch-through preventing layer; forming insulating structures between adjacent first fin portions and second fin portions, wherein surfaces of the insulating structure are higher than top surfaces of the first punch-through preventing layer; after forming the insulating structures, implanting second punch-through preventing ions into the PMOS region of the substrate, and making the second punch-through preventing ions diffuse into the second fin portions to form a second punch-through preventing layer; and performing an annealing process to activate the first punch-through preventing layer and the second punch-through preventing layer.

Another aspect of the disclosed subject matter provides a semiconductor structure, comprising: a substrate including an NMOS region and a PMOS region that are adjacent to each other; a first punch-through preventing layer in the NMOS region formed by implanting first punch-through preventing ions into the NMOS region of the substrate; a second punch-through preventing layer in the PMOS region formed by implanting second punch-through preventing ions into the PMOS region of the substrate; a plurality of fin portions formed by etching the substrate, including first fin portions in the NMOS region, and second fin portions in the PMOS region, wherein: surfaces of the substrate between the first fin portions in the NMOS region are lower than the first punch-through preventing layer, and surfaces of the substrate between the second fin portions in the PMOS region are lower than the second punch-through preventing layer; a first threshold voltage adjusting layer in the first fin portions, and a second threshold voltage adjusting layer in the second fin portions, wherein the first threshold voltage adjusting layer is located just above the first punch-through preventing layer, the second threshold voltage adjusting layer is located just above the second punch-through preventing layer; and insulating structures between adjacent first fin portions and second fin portions, wherein surfaces of the insulating structures are higher than top surfaces of the first punch-through preventing layer and the second punch-through preventing layer; wherein insulating structure in the NMOS region and the first punch-through preventing layer include diffusion preventing ions to prevent a diffusion of the first punch-through preventing ions.

Other aspects of the disclosed subject matter can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Figure 1:
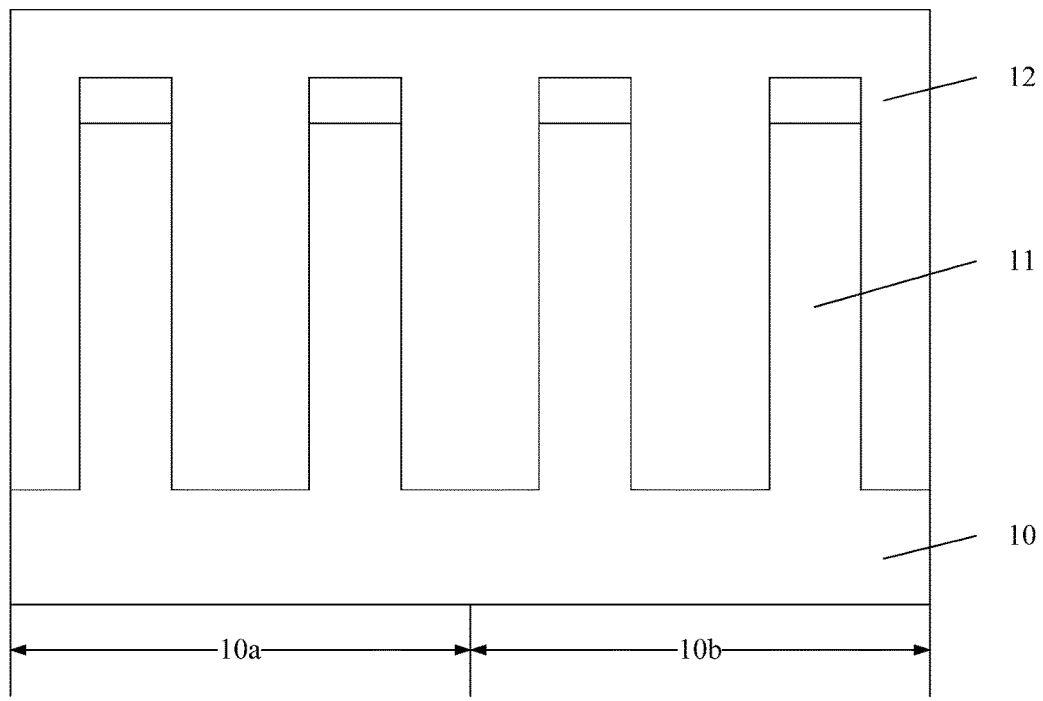
FIGS. 1-4 illustrate cross sectional structures of a semiconductor structure corresponding to certain stages of an existing fabricating process.

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

As the dimensions of semiconductor devices continually decrease, the Fin FET manufacturing process has been challenged. It is difficult to ensure a stable performance of the Fin FET. Combining with the existing fabricating process for forming a semiconductor structure, the reasons for the stability problem can be analyzed in the following.

Studies shows that, with the fin size for forming the Fin FET continually decrease, a punch-through phenomenon can easily occur at the bottom portions of the source region and the drain region. That is, the portion between the bottom of the source region and the bottom of the drain region is penetrated, and a leakage current can be generated at the bottom portions of the source region and the drain region. In order to overcome the bottom punch-through phenomenon, one method is to perform a punch-through preventing implantation in the fin portions. Inversion ions can be implanted into the portion between the bottom of the source region and the bottom of the drain region to isolate the bottom of the source region from the bottom of the drain region.

Referring to FIGS. 1-4, cross sectional structures of a semiconductor structure corresponding to certain stages of an existing fabricating process are shown.

Turning to FIG. 1, a substrate 10 can be provided. The substrate 10 can include a first region 10a and a second region 10b that is adjacent to the first region 10a. Fin portion 11 can be formed on the surface of the substrate. An insulating material film 12 can be formed on the surfaces of the substrate 10 and the fin portion 11.

Figure 2:
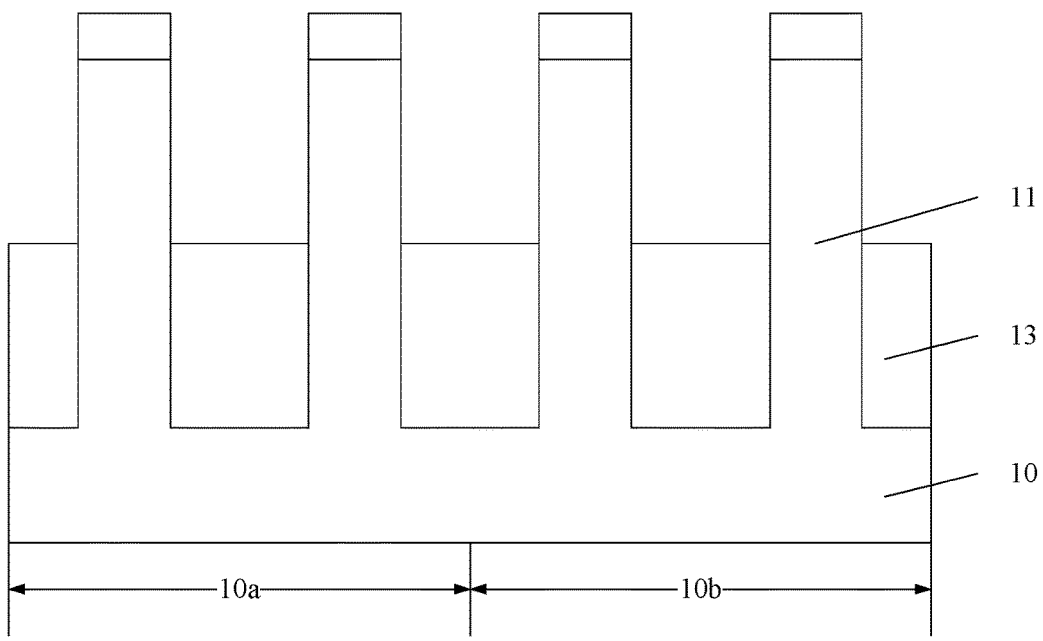

Turning to FIG. 2, the insulating material film 12 can be etched to form an insulating structure 13. The surface of the insulating structure 13 is lower than the top surface of the fin portion 11.

Figure 3:
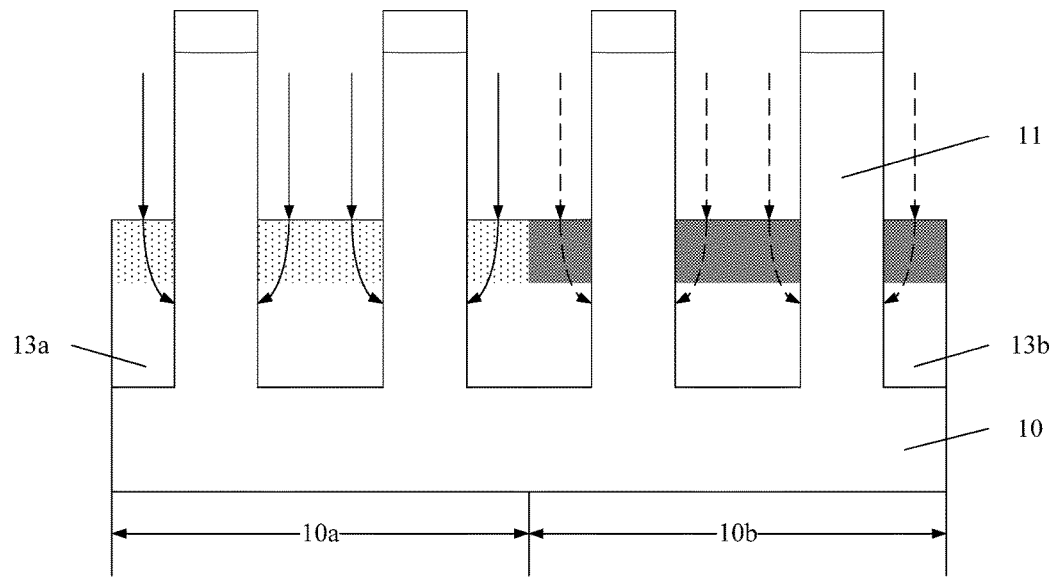

Turning to FIG. 3, a lateral straggle ion implantation process can be performed to implant ions to both of the isolating structure 13a in the first region 10a and the isolating structure 13b in the second region 10b respectively.

When the first area 10a is used for forming an NMOS transistors, and the second region 10b is used for forming a PMOS transistor, the ions implanted into the first region 10a can be P-type ions, the ions implanted into the second region 10b can be N-type ions such as boron ions.

Figure 4:
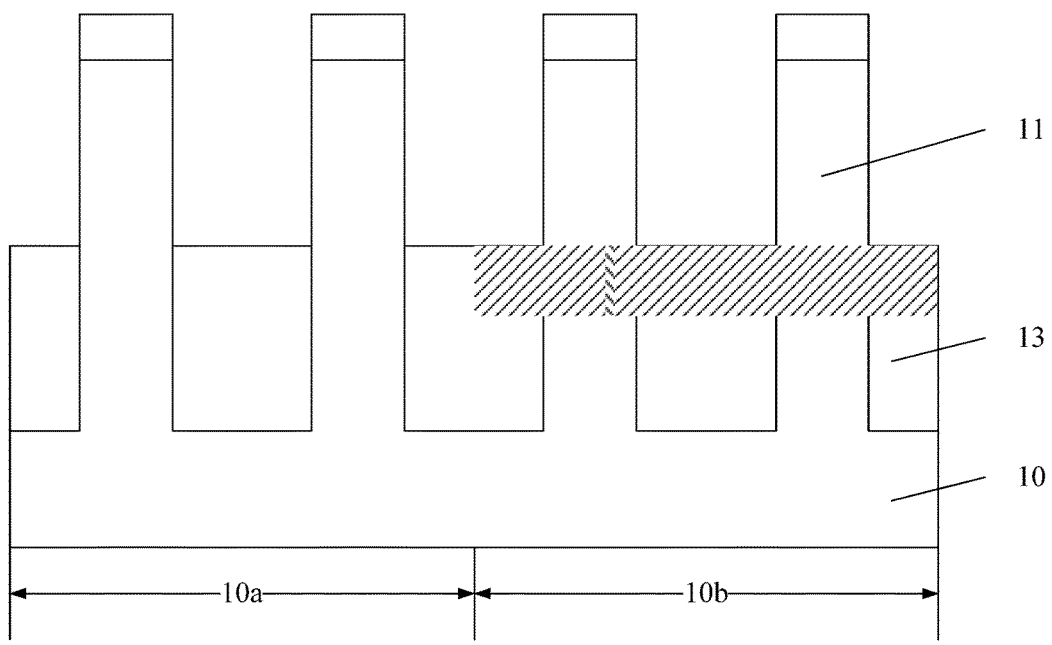

Turning to FIG. 4, an annealing process can be performed, so that the dopant ions in the insulating structure 13a of the first region 10a and the insulating structure 13b of the second region 10b can be respectively diffused into the fin portion 11a of the first region 10a and the fin portion 11b of the second region 10b. As such, a punch-through preventing layer can be formed in the first region 10a and the second region 10b.

In a practical fabricating process, since boron ions are easy to diffuse, the first region 10a may have a high-dose ion implantation. After the high-dose ion implantation, the annealing process may cause the ions in the first region 10a diffuse into not only the fin portion 11a of the first region 10a, but also the fin portion 11b of the second region 10b, as illustrated in FIG. 4. Thus, the performance of the semiconductor structure formed in the second region 10b may be affected.

Accordingly, the disclosed subject matter provides a semiconductor structure and a fabricating method thereof to solve the technique issue described above.

Figure 16:
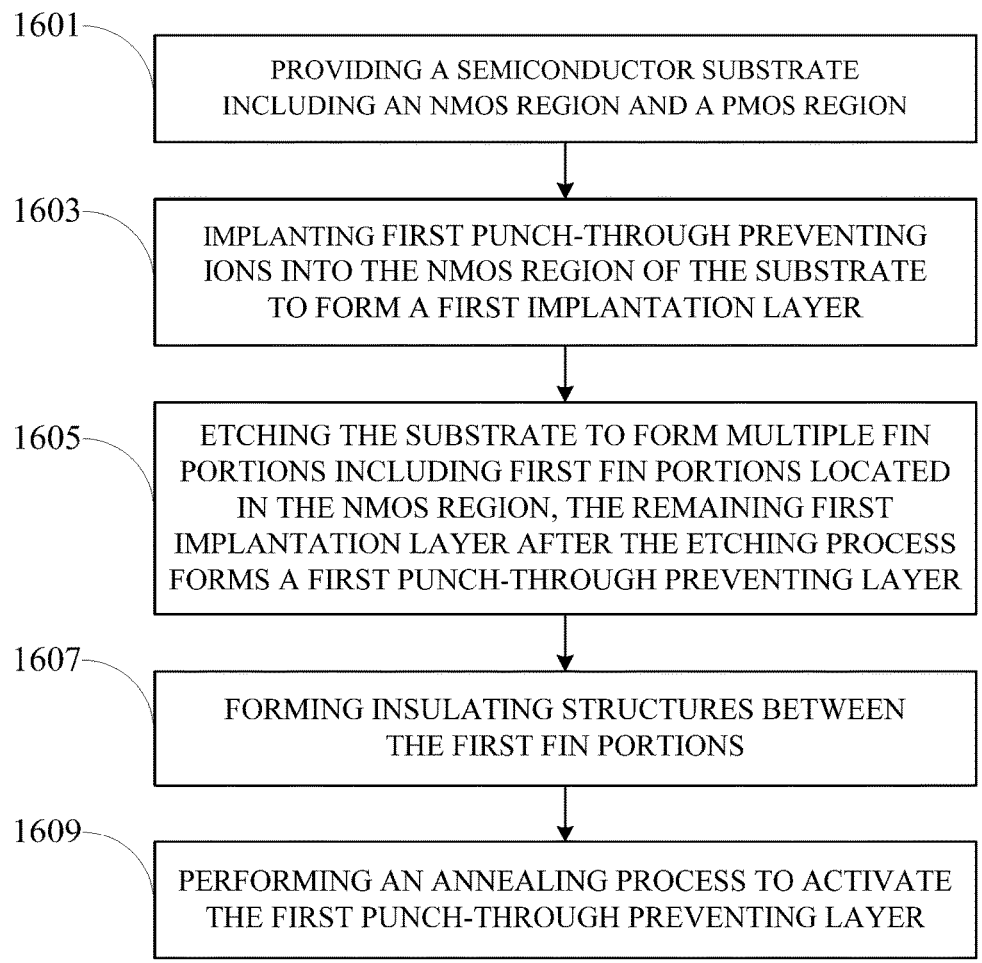
FIG. 16 illustrates a flow chart of an exemplary process for fabricating a semiconductor structure in accordance with some embodiments of the disclosed subject matter.

Referring to FIG. 16, a flow chart of an exemplary process for fabricating a semiconductor structure is shown in accordance with some embodiments of the disclosed subject matter. As illustrated, the disclosed process for fabricating a semiconductor structure can include the following steps.

At step 1601, a substrate can be provided. The substrate can include an NMOS region and a PMOS region that are adjacent to each other.

At step 1603, first punch-through preventing ions can be implanted into the NMOS region of the substrate to form a first implantation layer.

At step 1605, the substrate can be etched to form multiple fin portions including first fin portions located in the NMOS region. The substrate surfaces between the first fin portions are lower than the first implantation layer. The remaining first implantation layer after the etching process can form a first punch-through preventing layer.

At step 1607, insulating structures can be formed between the first fin portions. The surfaces of the insulating structures are higher than the top surfaces of the first punch-through preventing layer.

At step 1609, an annealing process can be performed to activate the first punch-through preventing layer.

In the disclosed fabricating process, the first punch-through preventing ions can be implanted directly into the NMOS region of the substrate to form the first implantation layer, then multiple fin portions can be formed by etching the substrate. The substrate surfaces between the first fin portions in the NMOS region are lower than the first implantation layer. The remaining first implantation layer in the first fin portions that is not etched forms the first punch-through preventing layer. As such, the first punch-through preventing ions are mainly distributed in the first fin portions. That is, the diffusion of the first punch-through preventing ions can be restrained, a dose loss of the first punch-through preventing ions due to the diffusion can be eliminated, and a possibility that the first punch-through preventing ions diffuse into the PMOS region is reduced. Therefore, the performance of the fabricated semiconductor structure can be improved, and the manufacturing yield of the semiconductor structure can be ensured.

Referring to FIGS. 5-12, cross sectional structures of an exemplary semiconductor structure corresponding to certain stages of an exemplary fabricating process are illustrated consistent with some embodiments of the disclosed subject matter.

Figure 5:
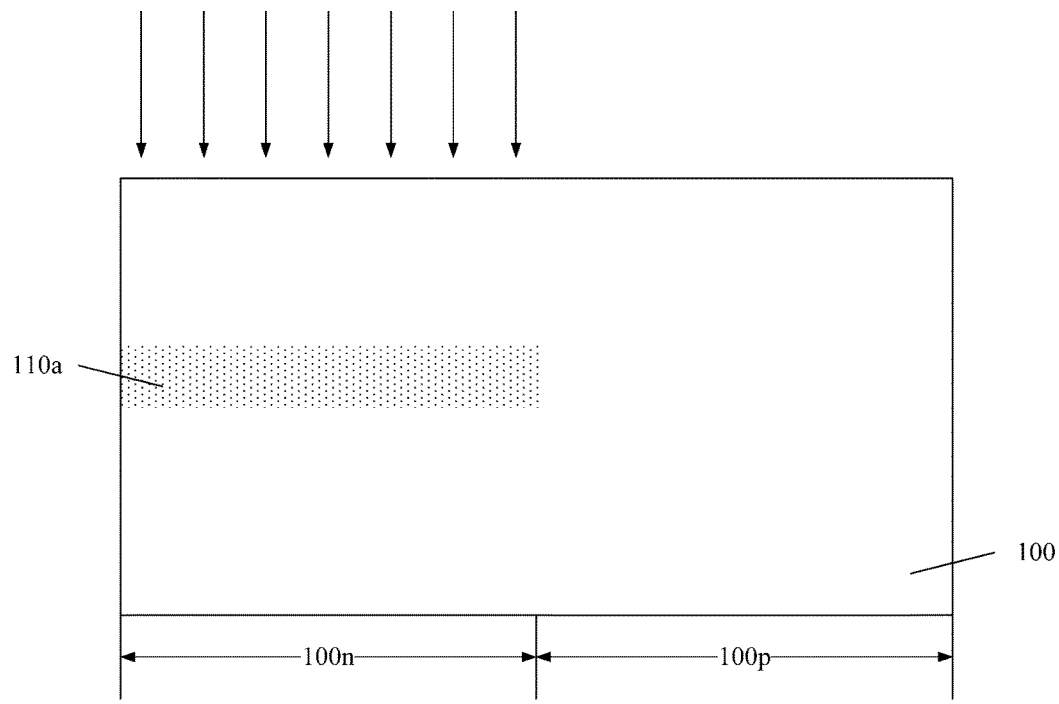
FIGS. 5-12 illustrate cross sectional structures of an exemplary semiconductor structure corresponding to certain stages of an exemplary fabricating process consistent with some embodiments of the disclosed subject matter.

Turning to FIG. 5, a substrate 100 can be provided (step 1061). The substrate 100 can include an NMOS region 100n and a PMOS region 100p that are adjacent to each other.

The NMOS region 100n is used for forming an NMOS transistor in the subsequent process, and the PMOS region 100p is used for forming a PMOS transistor in the subsequent process.

The substrate 100 can be used as a platform for the subsequent processes, and can be etched to form fin portions. In some embodiments, a material of the substrate 100 may be selected from monocrystalline silicon, polycrystalline silicon, or amorphous silicon. In some other embodiments, a material of the substrate 100 may be selected from silicon, germanium, gallium arsenide, or silicon germanium compound, or any other suitable semiconductor material. In the following description, silicon is used as an exemplary material of the substrate 100.

In some other embodiments, the substrate 100 may be selected from an epitaxial layer silicon structure, or a silicon above epitaxial layer structure. Specifically, the substrate can include a base substrate and a semiconductor layer on the surface of the base substrate. The semiconductor layer can be formed in the surface of the base substrate by using a selective epitaxial deposition process.

The base substrate may be a silicon substrate, a germanium silicon substrate, silicon carbide substrate, a silicon on insulator substrate, a germanium substrate, a glass substrate, or a Group III-V element compound substrate such as a gallium nitride substrate or a gallium arsenide substrate, or any another suitable base substrate. A material of the semiconductor layer can include silicon, germanium, silicon germanium carbide, or any other suitable semiconductor material. The materials of the base substrate and the semiconductor layer can be selected from those materials that are adapted to the fabricating process requirements, easy to be integrated, and suitable for forming the fin portions. A thickness of the semiconductor layer can be controlled by an epitaxial process to precisely control the height of the formed fin portions.

Note that, in some embodiments, an oxide layer or other dielectric layer (not shown in the figures) can be formed on the surface of the substrate 100 to protect the substrate 100.

Still referring to FIG. 5, first punch-through preventing ions can be implanted into the NMOS region 100n of the substrate to form a first implantation layer 110a in the NMOS region 100n of substrate (step 1603).

The first implantation layer 100a can be used to form a first punch-through preventing layer in the subsequent process. In some embodiments, the NMOS region is used for forming an NMOS transistor, so the first punch-through preventing ions can be P-type ions, such as boron ions or boron difluoride.

Specifically, the first punch-through prevention layer formed from the first implantation layer 110a should be located under the source region or drain region that are formed in the subsequent process. Accordingly, parameters of the implanting process for implanting the first punch-through preventing ions into the NMOS region 100n of the substrate can be determined as the following. The implanting ions include boron ions. An implantation energy can be in a range from 5 KeV to 12 KeV. An implantation dose can be in a range from $1.0E13$ atom/cm$^2$ to $1.5E14$ atom/cm$^2$. An implantation angle can be in a range from 7° to 10°. The implantation angle can be referred to as an angle between the injection direction and the normal direction of the surface of substrate 100.

Figure 6:
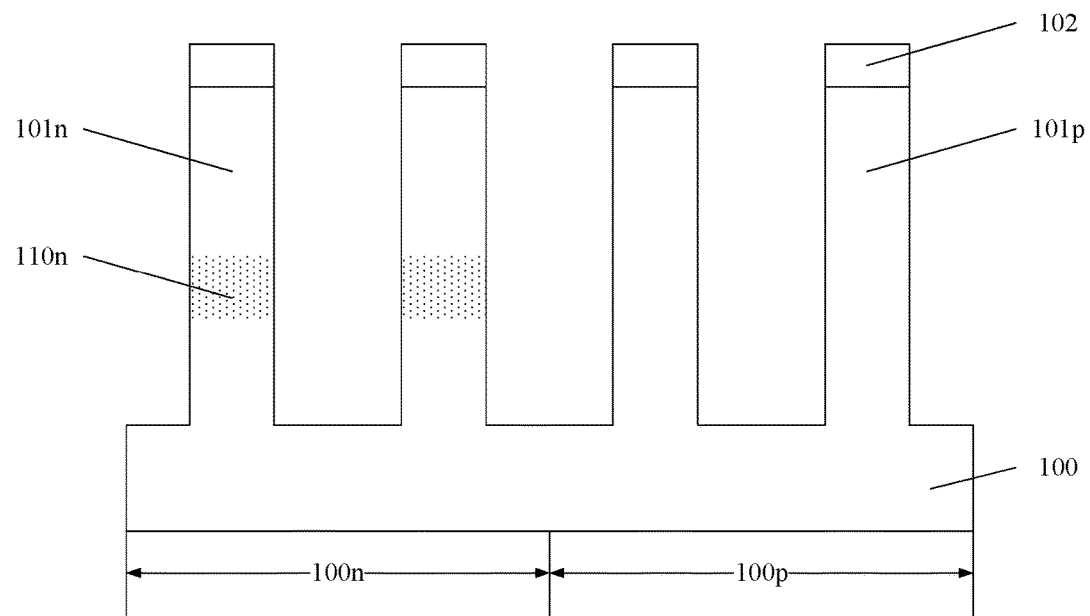

Turning to FIG. 6, the substrate 100 can be etched to form multiple fin portion, including first fin portions 101n located in the NMOS region 100n of the substrate 100 (step 1605). The surfaces of the substrate 100 between first fin portions are lower than the first implantation layer 110a. The remaining portions of the first implantation layer 110a between the first fin portions 101n that are not etched can form the first punch-through preventing layer 110n.

In some embodiments, the multiple fin portions further include second fin portions located in the PMOS region 101p of the substrate 100.

Specifically, forming the multiple fin portions can include the following steps. Firstly, a patterned mask layer 102 can be formed on the surface of the substrate 100. The mask layer 102 can be used to define the positions and sizes of the fin portions. Then, using the mask layer 102 as a mask, the substrate 100 can be etched to remove a partial thickness of the substrate 100 to form multiple fin portions. The multiple fin portions can include first fin portions located in NMOS region 101n and second fin portions located in PMOS region 101p.

Note that, in some embodiments, after the etching process, the top surfaces of the first portions 101n and the second fin portions 101p are covered by the mask layer 102. The mask layer 102 can be used as an etching mask during the process for forming the first fin portions 101n and the second fin portions 101p. Further, the mask layer 102 can also protect the top surfaces of the first fin portions 101n and the second fin portions 101p in the subsequent processes. In some other embodiments, the top surfaces of the first fin portions 101n and the second fin portions 101p are not covered by a mask layer.

In some embodiments, a distance between adjacent first fin portions 101n and second fin portions 101p can be in a range from 50 nanometers to 80 nanometers.

A process for forming the patterned mask layer 102 can include the following steps. First, a mask material layer can be formed on the surface of the substrate 100. Then a patterned layer can be formed on the surface of the mask material layer. Using the patterned layer as a mask, the mask material layer can be etched to expose the surface of the substrate 100. Thus, the patterned mask layer 102 can be formed.

In some embodiments, the patterned layer can be a patterned photoresist layer formed by using a coating process and a photolithography process. In some other embodiments, in order to narrow the sizes of the first fin portions 101n and the second fin portions 101p, as well as the distances between adjacent first fin portions 101n and second fin portions 101p, the patterned layer can be formed by using a multiple mask patterning process. Specifically, the multiple mask patterning process can include a self-aligned double patterned (SaDP) process, a self-aligned triple patterned (SaTP) process, or a self-aligned double double patterned (SaDDP) process.

Further, as illustrated in FIG. 6, the surfaces of the substrate 100 between first fin portions 101n are lower than the bottom of the first implantation layer 110a. The remaining portions of the first implantation layer 110a between the first fin portions 101n that are not etched can form the first punch-through preventing layer 110n.

The first punch-through preventing layer 110n can be configured with the source region and drain region formed subsequently in the NMOS region 100n to form a PN junction. Thus a reverse isolation between the source region and the drain region can be formed to increase the punch-through voltage between the source region and the drain region. As such, the punch-through phenomenon at the bottom of the source region and drain region can be eliminated.

In some embodiments, the first punch-through prevention layer 110n is distributed in the discrete first fin portions 101n, and the NMOS region 100n and the PMOS region are isolated by a groove. Thus, the outward diffusion of the first punch-through preventing ions can be restrained, the implanting dose loss of the first punch-through preventing ions can be eliminated, and a possibility that the first punch-through preventing ions diffuse into the PMOS region can be reduced.

Figure 7:
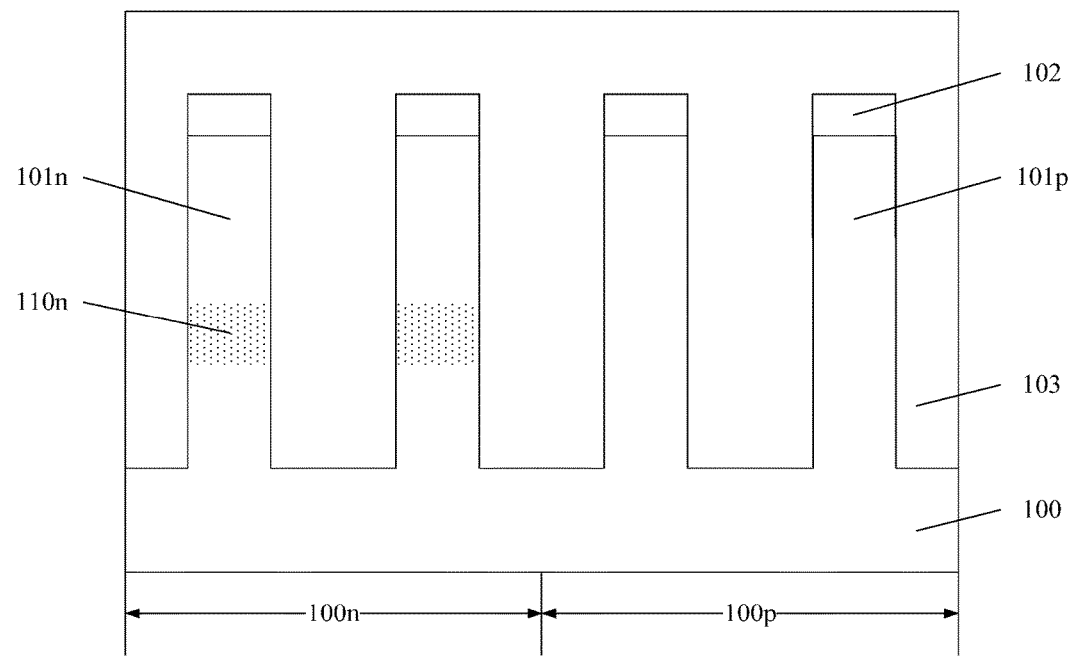
Figure 8:
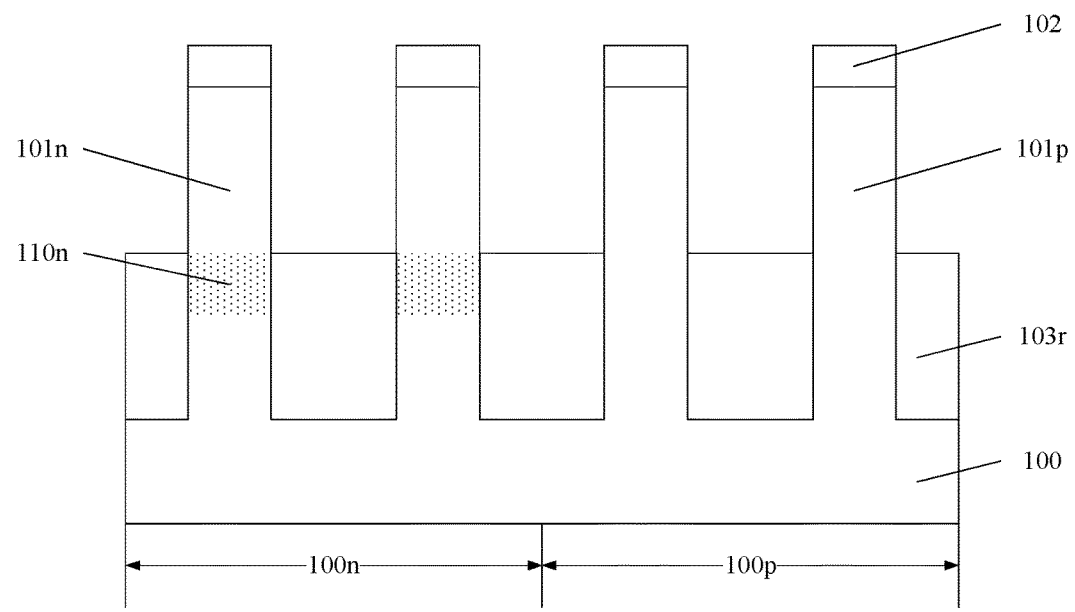

Turning to FIGS. 7 and 8, an insulating structure 103r can be formed between adjacent first fin portions 101n (step 1607). The surfaces of the insulating structure 103r can be higher than the top surfaces of the first punch-through preventing layer 110n.

In some embodiment, the insulating structure 103r can also be formed between adjacent second fin portions 101p.

It should be noted that, during the process for forming the first fin portions 101a and the second fin portions 101b, the etched surface of the substrate 100 can have minor damages and unevenness. In order to repair the minor damages and unevenness to improve the performance of the formed semiconductor structure, after forming the first fin portions 101a and second fin portions 101b, the fabricating process can further include a step for forming a liner oxide layer (not shown in the figures) on the surfaces of the substrate 100, the first fin portions 101a, and the second fin portions 101b. The liner oxide layer can not only smooth the surfaces of the substrate 100, the first fin portions 101a, and the second fin portions 101b, but also round the sharp angles of the substrate 100, the first fin portions 101a, and the second fin portions 101b. Further, the liner oxide layer can serve as a buffer layer between the insulating structure 103r and the substrate 100, the first fin portions 101a, and the second fin portions 101b to reduce lattice mismatch. Specifically, the liner oxide layer can be formed by using a chemical vapor deposition process, or a thermal oxidation process.

In some other embodiments, the first fin portions 101a and the second fin portions 101b can be annealed directly without forming a liner oxide layer on the surfaces of the first fin portions 101a and the second fin portions 101b.

In the following description in connection with FIGS. 7 and 8, specific steps for forming the insulating structure 103r are described in details.

Referring to FIG. 7, first, an insulating material layer 103 can be formed. A top surface of the insulating material layer 103 is not lower than the top surfaces of the first fin portions 101a and the second fin portions 101b.

The insulating material layer 103 is used for forming the insulating structure. In some embodiments, the insulating material layer 103 can fill the gaps of the first fin portions 101a and the second fin portions 101b, and can cover the top surfaces of the first fin portions 101a and the second fin portions 101b.

The material of the insulating structure can be an oxide for example, thus the material of the insulating material layer 103 is also an oxide. In some embodiments, the distance between adjacent first fin portions 101n and second fin portions 101p is in a range of 50 nanometers to 80 nanometers, so the adjacent first fin portions 101n and second fin portions 101p has a relatively larger aspect ratio. In order that the insulating material layer 103 can sufficiently fill between the adjacent first fin portions 101n and second fin portions 101p, a flowable chemical vapor deposition process (FCVD) can be used for forming the insulating material layer 103.

Specifically, using the flowable chemical vapor deposition process to form the insulating material layer 103 can include forming a precursor layer. The surface of the precursor layer is not lower than the top surfaces of the fin portions. The precursor layer can be in a fluid state. In some embodiments, the surface of the precursor layer is higher than the top surfaces of the first fin portions 101n and the second fin portions 101p.

In some embodiments, a material of the precursor layer can be a silicon-containing flowable material. The flowable material can be one or more polymers that include Si—H bond, Si—N bond, or the Si—O bond. A process temperature for forming the precursor layer can be in a range from 60° C. to 70° C. In one embodiment, the process temperature is 65° C.

Since the precursor layer is in a fluid state, the precursor layer can sufficiently fill between the first fin portions 101n and the second fin portions 101p. As such, the subsequently formed insulating structure is capable of filling between the first fin portions 101n and the second fin portions 101p. Thereafter, an annealing process can be performed to cure the precursor layer to form the insulating material layer 103. In some embodiments, the insulating material layer 103 can also cover the top surfaces of the first fin portions 101n and the second fin portions 101p.

During the annealing process, if the annealing temperature is too high, the first punch-through preventing ions in the first implantation layer 110a may be driven to diffuse into the insulating material layer 103, which may cause the loss of implanted dose. Therefore, in some embodiments, the annealing process for curing the precursor layer can be a low-temperature annealing process. Specifically, a process temperature of the low-temperature annealing process can be in a range from 500° C. to 600° C., and a duration time of the low-temperature annealing process can be in a range from 20 minutes to 40 minutes.

After forming the insulating material layer 103, the insulating material layer 103 can be planarized to provide a flat platform for the subsequent processes. Specifically, a chemical mechanical polishing can be used for planarizing the insulating material layer 103.

Turning to FIG. 8, the insulating material layer 103 can be etched to make the top surfaces of the insulating material layer 103 lower than the top surfaces of the fin portions. As such, the insulating structure 103r can be formed.

The insulating structure 103r can be located between the first fin portions 101n and the second fin portions 101p. The surfaces of the insulating structure 103r located between the first fin portions 101n are higher than the top surfaces of the first punch-through preventing layer 110n.

The insulating structure 103r can be used for realizing an electrical isolation between semiconductor structures. Specifically, by using an etching process, the top surfaces of the insulating material layer 103 lower than the top surfaces of the first fin portions 101n and the second fin portions 101p, so that the sidewalls of the first fin portions 101n and the second fin portions 101p can be exposed. As such, a subsequently formed gate structure can cover the sidewall surfaces of the first fin portions 101n and the second fin portions 101p.

In some embodiments, the insulating material layer 103 can be etched by using an isotropic dry etching process to reduce the sidewall damage of the first fin portions 101n and the second fin portions 101p. Specifically, etching gases of the isotropic dry etching process can include, for example, $NH_3$ and $NF_3$. $NH_3$ and $NF_3$ can be used to etch the silicon oxide material without damaging the silicon material. Thus, it is possible to simultaneously etch the insulating material layer 103 and reduce the sidewall damage of the first fin portions 101n and the second fin portions 101p. Further, $NH_3$ and $NF_3$ have a relatively high etching selectivity to the silicon oxide material and the silicon nitride material. So it is possible to simultaneously etch the insulating material layer 103 and reduce the etching damage to the masking layer 102. As such, the masking layer 102 can ensure the protection to the top surfaces of the first fin portions 101n and the second fin portions 101p.

In some other embodiments, wet etching process may also be used to etch the insulating material layer 103. By using the wet etching process, the surface damage to the first fin portions 101n and the second fin portions 101p can also be reduced.

Figure 9:
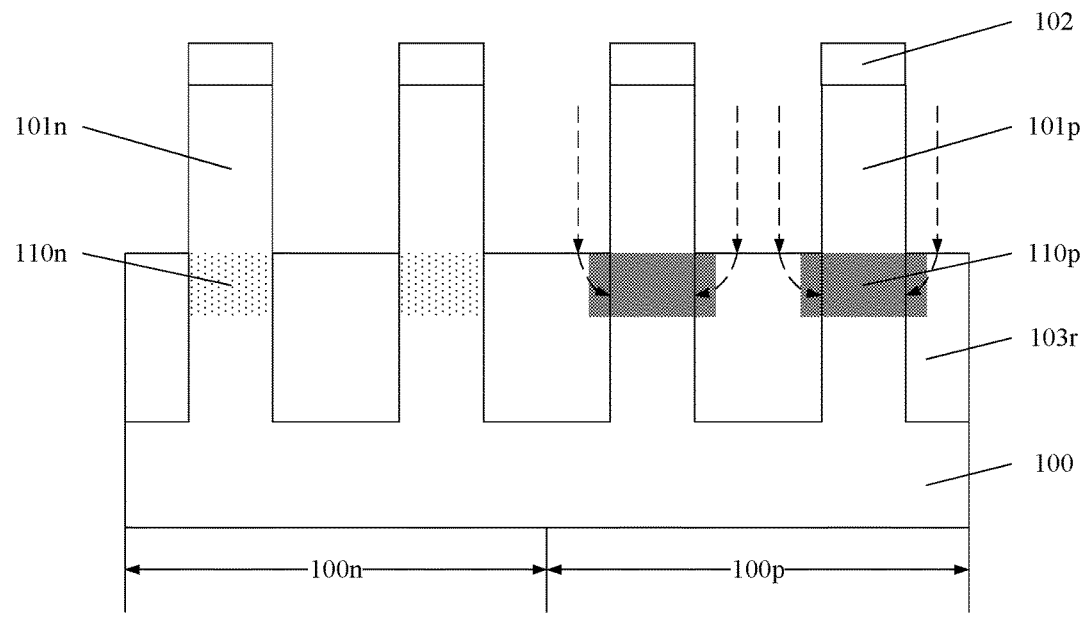
Figure 10:
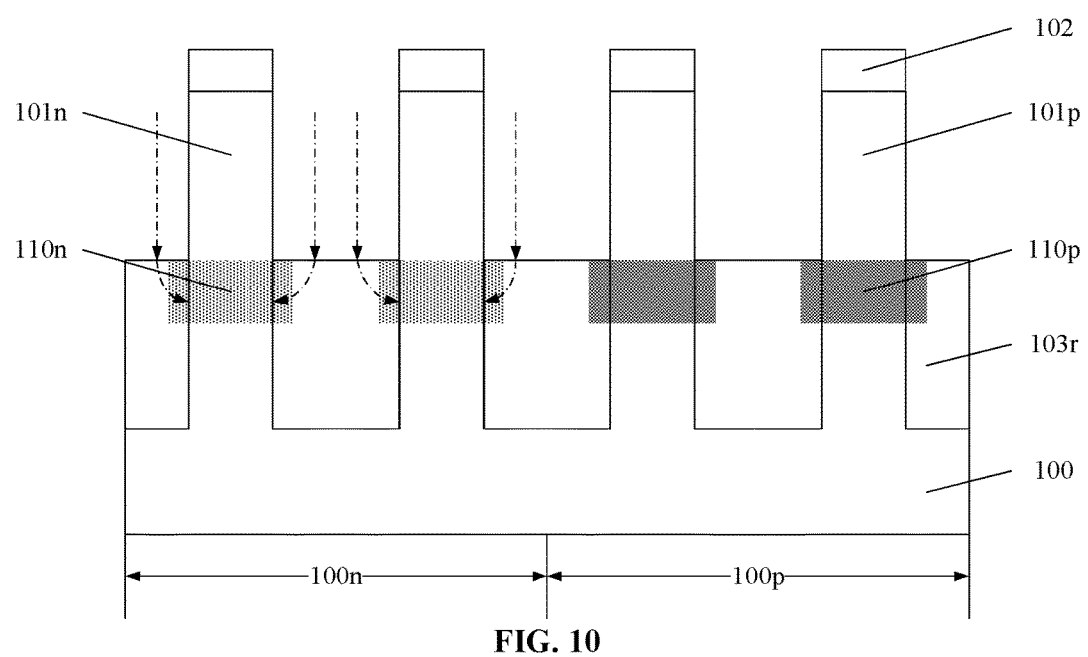
Figure 11:
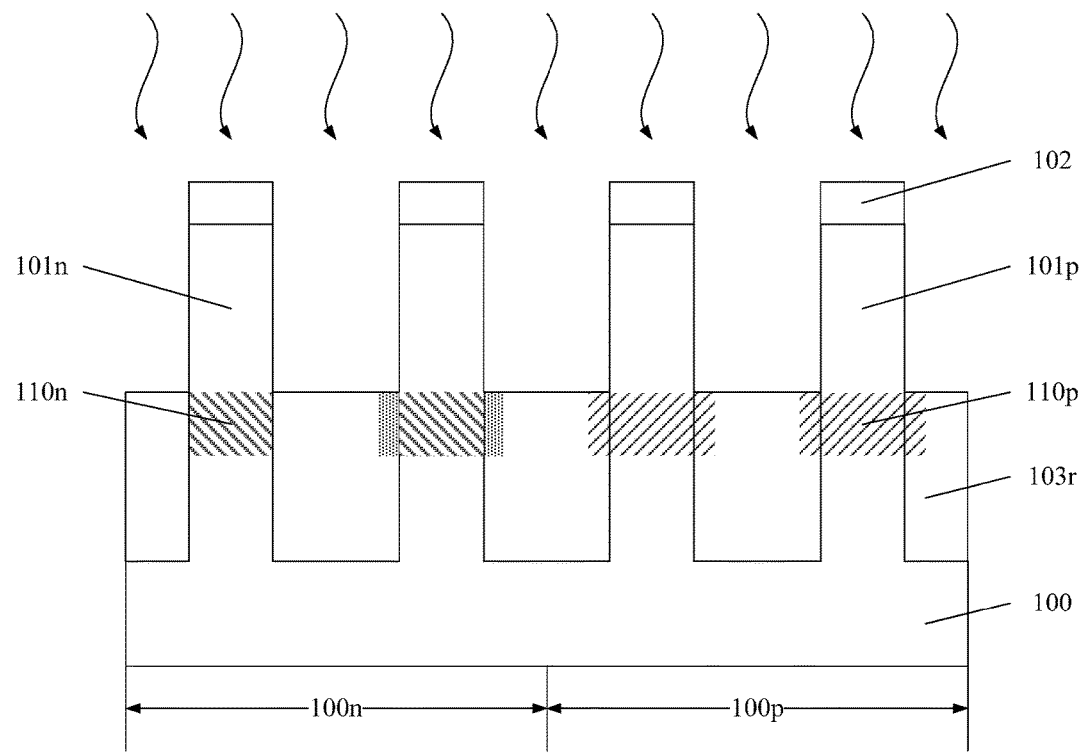

Referring to FIGS. 9-11, an annealing process can be performed to activate the first punch-through preventing layer (step 1609).

In some embodiments, as illustrated in FIG. 9, after forming the insulating structure 103r and before the annealing process, second punch-through preventing ions can be implanted into the insulating structure 103r. And the implanted second punch-through preventing ions can be driven to diffuse into the second fin portions 101p to form a second punch-through preventing layer 110p in the second fin portions 101p.

The second punch-through preventing layer 110p can be configured with the source region and drain region formed subsequently in the PMOS region 100p to form a PN junction. Thus a reverse isolation between the source region and the drain region can be formed to increase the punch-through voltage between the source region and the drain region. As such, the punch-through phenomenon at the bottom of the source region and drain region can be eliminated.

In some embodiments, a lateral straggle ion implantation process can be used for implanting the second punch-through preventing ions to the insulating structure in the PMOS region, so that the second punch-through preventing ions can diffuse into the second fin portions 101p to form the second punch-through preventing layer 110p in the second fin portions 101p.

Specifically, the second punch-through prevention layer 110p should be located under the source region or drain region that are formed in the subsequent process. Accordingly, parameters of the lateral straggle ion implantation process for implanting the second punch-through preventing ions into the PMOS region 100p of the substrate can be determined as the following. The second punch-through preventing ions can include arsenic ions. An implantation energy can be in a range from 70 KeV to 110 KeV. An implantation dose can be in a range from $5.0E12$ atom/cm$^2$ to $7.0E13$ atom/cm$^2$. An implantation angle can be in a range from 7° to 10°. The implantation angle may be referred to an angle between the injection direction and the normal direction of the surface of substrate 100.

Referring to FIG. 10, in order to further suppress the diffusion of the first punch-through preventing ions, in some embodiments, after forming the insulating structure 103r and before the annealing process, diffusion preventing ions can be implanted into the insulating structure 103r in the NMOS region 100n. The implanted diffusion preventing ions can be driven to enter into the first punch-through preventing layer to prevent the diffusion of the first punch-through preventing ions.

The diffusion preventing ions are capable of binding to the first punch-through preventing ions in the first punch-through preventing layer 110n to form clusters with a lower free energy. Thus, the diffusion of the first punch-through preventing ions can be further restrained, thereby a dose loss of the first punch-through preventing ions due to the diffusion can be eliminated, and a possibility that the first punch-through preventing ions diffuse into the PMOS region can be reduced. Therefore, the performance of the fabricated semiconductor structure can be improved, and the manufacturing yield of the semiconductor structure can be ensured.

Specifically, the diffusion preventing ions can include carbon ions and nitrogen ions. The diffusion preventing ions can be implanted into the insulating structure 103r in the NMOS region 100n by using a composite implantation process and a lateral straggle ion implantation process. An implantation energy can be in a range from 8 KeV to 20 KeV. An implantation dose can be in a range from 1.5E15 atom/cm$^2$ to 4.5E15 atom/cm$^2$. An implantation angle can be 0°. The implantation angle may be referred to an angle between the injection direction and the normal direction of the surface of substrate 100.

Referring to FIG. 11, an annealing process can be performed to activate the first punch-through preventing layer 110n.

After the annealing process, the first punch-through preventing ions in the first punch-through preventing layer 110n can be relaxed into lattice positions. As such, the first punch-through preventing layer 110n can be activated, together with the subsequently formed source region and drain region within the first fin portions 101n, a PN junction can be constituted to achieve the punch-through preventing function.

Similarly, the annealing process can also relax the second punch-through preventing ions in the second punch-through preventing layer 110p into lattice positions. As such, the second punch-through preventing layer 110p can be activated, together with the subsequently formed source region and drain region within the second fin portions 101p, a PN junction can be constituted to achieve the punch-through preventing function.

The annealing process may be a tube furnace annealing process, a rapid thermal annealing process, or a spike annealing process. In some embodiments, an annealing temperature in the annealing process can be in a range from 900° C. to 1000° C., and a duration time of the annealing process can be in a range from 10 seconds to 20 seconds.

After performing the annealing process, a doping concentration of the first punch-through preventing ions in the first punch-through preventing layer 110n can be in a range from 1.0E18 atom/cm$^3$ to 5.0E19 atom/cm$^3$, and a doping concentration of the second punch-through preventing ions in the second punch-through preventing layer 110p can be in a range from 1.0E18 atom/cm$^3$ to 5.0E19 atom/cm$^3$.

It should be noted that, the annealing process can also relax the diffusion preventing ions, so that the diffusion preventing ions can be more uniformly distributed in the first fin portions, which may be more conducive to combine the diffusion preventing ions and the first punch-through preventing ions to inhibit the first punch-through preventing ions. After the annealing process, a dopant ion concentrations of the diffusion preventing ions in the first punch-through preventing layer can be in a range from 1.0E19 atom/cm$^3$ to 5.0E20 atom/cm$^3$.

Figure 12:
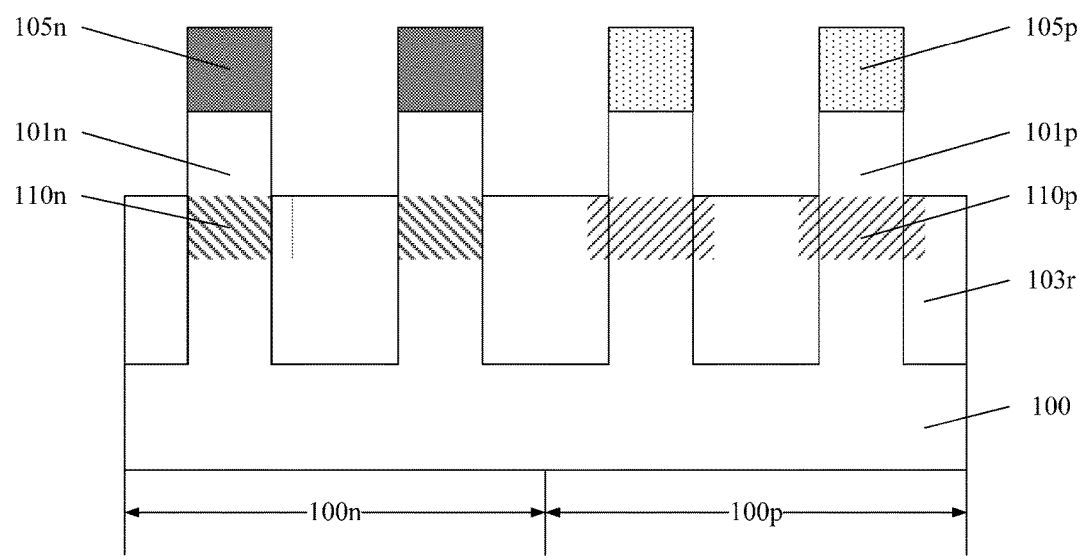

Turning to FIG. 12, after the annealing process, a first threshold voltage adjusting layer 105n can be formed in the first fin portions 101n. In some embodiments, a second threshold voltage adjusting layer 105p can be formed in the second fin portions 101p.

In some embodiments, the first fin portions 101n in the NMOS region is used for forming an NMOS transistor, and the second fin portions 101p in the PMOS region is used for forming a PMOS transistor. Thus, by implanting N-type ions into the first fin portions 101n and implanting P-type ions into the second fin portions 101p, the first threshold voltage adjusting layer 105n and the second threshold voltage adjusting layer 105p can be formed in the first fin portions 101n and the second fin portions 101p, respectively.

The threshold voltage adjusting layer can be used for adjusting the threshold voltage of the formed Fin FET. A doping type of the threshold voltage adjusting layer is opposite to the doping type of the punch-through preventing layer, and is related to the type and the specific properties of the formed Fin FET.

Specifically, the first threshold voltage adjusting layer 105n is located just above the first punch-through preventing layer 110n, so that the subsequently formed source region and the drain region of the NMOS transistor in the first threshold voltage adjusting layer can be combined with the first punch-through preventing layer 110n to form a PN junction for preventing the source-drain punch-through phenomenon.

Similarly, the second threshold voltage adjusting layer 105p is located just above the second punch-through preventing layer 110p, so that the subsequently formed source region and the drain region of the PMOS transistor in the second threshold voltage adjusting layer can be combined with the second punch-through preventing layer 110p to form a PN junction for preventing the source-drain punch-through phenomenon.

Note that, in some embodiments, the top surfaces of the first fin portions 101n and the second fin portions 101p can be covered with the mask layer 102, so that after performing the annealing process and before forming the threshold voltage adjusting layer, the mask layer 102 should be removed. Specifically, the mask layer 102 can be removed by using a wet etching process or ashing process to expose the top surfaces of the first fin portions 101n and the second fin portion 101p.

Figure 13:
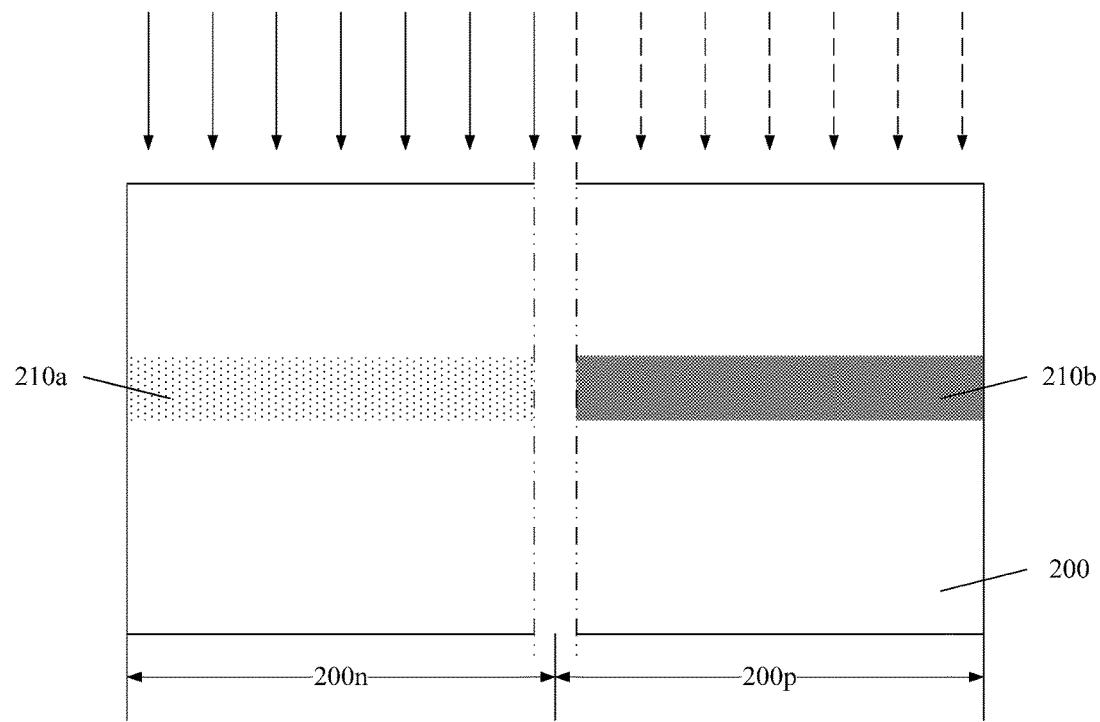
FIGS. 13-15 illustrate cross sectional structures of another exemplary semiconductor structure corresponding to certain stages of another exemplary fabricating process consistent with some other embodiments of the disclosed subject matter.
Figure 14:
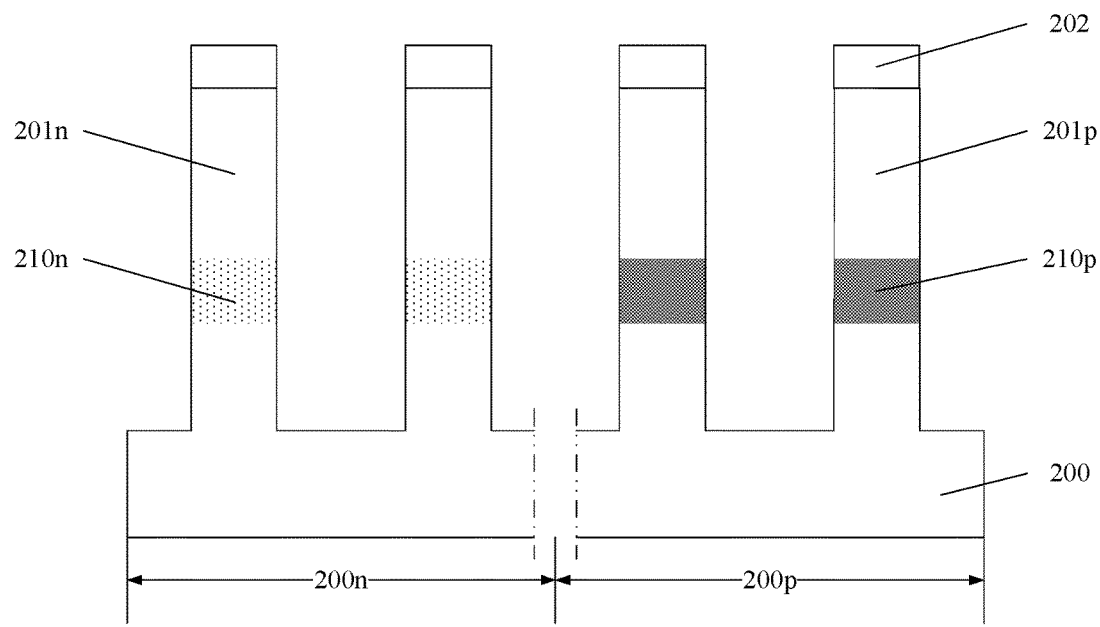
Figure 15:
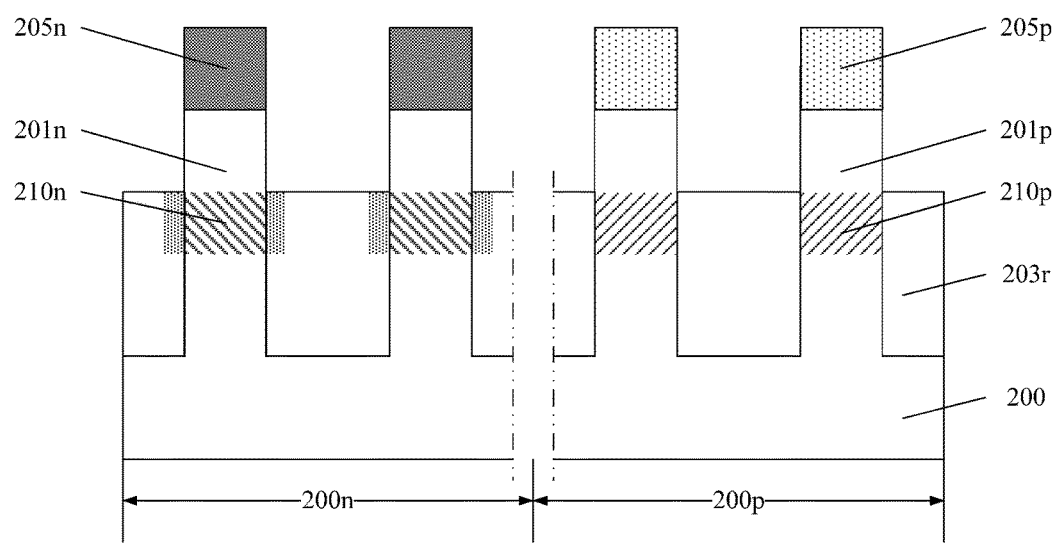

Referring to FIGS. 13-15, cross sectional structures of another exemplary semiconductor structure corresponding to certain stages of another exemplary fabricating process are shown consistent with some other embodiments of the disclosed subject matter.

Note that, some steps in connection with FIGS. 13-15 that are same or similar to the steps described above in connection with FIGS. 5-12 are not repeated herein.

In some embodiments, after providing the substrate and before etching the substrate, the fabricating process can further comprise implanting second punch-through preventing ions into the PMOS region of the substrate to form a second implantation layer in the PMOS region of the substrate.

Specifically, as illustrated in FIG. 13, a substrate 200 including an NMOS region 200n and a PMOS region 200p can be provided. The NMOS region 200n and the PMOS region 200p are adjacent to each other.

The NMOS region 200n is used for forming the NMOS transistor in the subsequent process, and the PMOS region 200p is used for forming a PMOS transistor in the subsequent process.

Next, first punch-through preventing ions can be injected into the NMOS region 200n of the substrate to form a first implantation layer 210a in the NMOS region of the substrate 200.

Further, second punch-through preventing ions can be injected into the PMOS region 200p of the substrate to form a second implantation layer 210b in the NMOS region of the substrate 200.

The first implantation layer 210a is used for forming a first punch-through preventing layer, and the second implantation layer 210b is used for forming a second punch-through preventing layer. In some embodiments, the NMOS region is used for forming an NMOS transistor in the subsequent process, and the PMOS region is used for forming a PMOS transistor in the subsequent process. Therefore, the first punch-through preventing ions can be P-type ions, such as boron ions, or boron difluoride. The second punch-through preventing ions can be N-type ions such as arsenic ions.

Turning to FIG. 14, the substrate 200 can be etched to form multiple fin portions, including first fin portions 201n located in the NMOS region 201, and second fin portions 201p located in the PMOS region 200p.

The surfaces of the substrate 200 between adjacent first fin portions 201n are lower than the first implantation layer 201a. The remaining first implantation layer 201a between adjacent first fin portions 201n that are not etched constitute the first punch-through preventing layer 210n.

The surfaces of the substrate 200 between adjacent second fin portions 201p are lower than the second implantation layer 201b. The remaining second implantation layer 201b between adjacent second fin portions 201p that are not etched constitute the second punch-through preventing layer 210p.

In some embodiments, the second punch-through prevention layer 210p is distributed in the discrete second fin portions 201p. Thus, the outward diffusion of the second punch-through preventing ions can be restrained, the implanting dose loss of the second punch-through preventing ions can be eliminated, and a possibility that the second punch-through preventing ions diffuse into the NMOS region can be reduced. As such, the cost for forming the semiconductor structure can be reduced, and the manufacturing yield can be increased.

Turning to FIG. 15, after forming the first fin portions 201n and the second fin portions 201p, an insulating structure 203r can be formed between adjacent first fin portions 201n and the second fin portions 201p. The surfaces of the insulating structure 203r can be higher than the top surfaces of the second punch-through preventing layer 210p.

Next, an annealing process can be performed to activate the first punch-through preventing layer 210n and the second punch-through preventing layer 201p. Then, a first threshold voltage adjusting layer 205n can be formed in the first fin portions 201n, and a second threshold voltage adjusting layer 205p can be formed in the second fin portions 201p.

Accordingly, in the disclosed subject matter, the first punch-through preventing ions can be implanted directly into the NMOS region of the substrate to form the first implantation layer, then multiple fin portions can be formed by etching the substrate. The substrate surfaces between the first fin portions in the NMOS region are lower than the first implantation layer. The remaining first implantation layer in the first fin portions that is not etched forms the first punch-through preventing layer. As such, the first punch-through preventing ions are mainly distributed in the first fin portions. That is, the diffusion of the first punch-through preventing ions can be restrained, a dose loss of the first punch-through preventing ions due to the diffusion can be eliminated, and a possibility that the first punch-through preventing ions diffuse into the PMOS region is reduced. Therefore, the performance of the fabricated semiconductor structure can be improved, and the manufacturing yield of the semiconductor structure can be ensured.

Further, in some alternative embodiments, diffusion preventing ions can be implanted into the insulating structure in the NMOS region. The diffusion preventing ions can bind to the first punch-through preventing ions in the first punch-through preventing layer to form clusters with a lower free energy. Thus, the diffusion of the first punch-through preventing ions can be further restrained, thereby a dose loss of the first punch-through preventing ions due to the diffusion can be eliminated, and a possibility that the first punch-through preventing ions diffuse into the PMOS region can be reduced. Therefore, the performance of the fabricated semiconductor structure can be improved, and the manufacturing yield of the semiconductor structure can be ensured.

Additionally, before forming the fin portions, the second punch-through preventing ions can be implanted directly into the PMOS region of the substrate to form the second implantation layer, then multiple fin portions can be formed by etching the substrate. The substrate surfaces between the second fin portions in the PMOS region are lower than the second implantation layer. The remaining second implantation layer in the second fin portions that is not etched forms the second punch-through preventing layer. Thus, the outward diffusion of the second punch-through preventing ions can be restrained, the implanting dose loss of the second punch-through preventing ions can be eliminated, and a possibility that the second punch-through preventing ions diffuse into the NMOS region can be reduced. As such, the cost for forming the semiconductor structure can be reduced, and the manufacturing yield can be increased.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a semiconductor structure, and a fabricating method thereof are provided. In summarize, the disclosed semiconductor structure fabricating method can include a channel stop process for Static Random Access Memory (SRAM) devices. The channel stop process can be performed on 14 nm FIN FET devices. The channel stop implantation can be processed before the FIN formation for the NMOS device. During the FIN formation, the doped dose can be removed in the Shallow trench isolation (STI) region. And a PMOS channel stop IMP is followed. Next, a carbon and nitrogen co-implementation can be introduced by the lateral straggle implementation by using FIN hard mask. The co-implementation can be used to inhibit the boron ions diffusion during the subsequent thermal annealing process to active the channel stop the implementation.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for forming a semiconductor structure, comprising:
providing a substrate including an NMOS region and a PMOS region that are adjacent to each other;
implanting first punch-through preventing ions into the NMOS region of the substrate to form a first implantation layer;
implanting second punch-through preventing ions into the PMOS region of the substrate to form a second implantation layer;
etching the substrate to form a plurality of fin portions, including first fin portions in the NMOS region, and second fin portions in the PMOS region, wherein:
surfaces of the substrate between the first fin portions in the NMOS region are lower than the first implantation layer,
the remaining first implantation layer in the first fin portions that is not etched forms a first punch-through preventing layer,
surfaces of the substrate between the second fin portions in the PMOS region are lower than the second implantation layer, and
the remaining second implantation layer in the second fin portions that is not etched forms a second punch-through preventing layer;
forming insulating structures between adjacent first fin portions and second fin portions, wherein surfaces of the insulating structures are higher than top surfaces of the first punch-through preventing layer and the second punch-through preventing layer;
implanting diffusion preventing ions into insulating structure in the NMOS region after forming the insulating structure; and
performing an annealing process to activate the first punch-through preventing layer and the second punch-through preventing layer after implanting diffusion preventing ions into insulating structure in the NMOS region.

2. The method of claim 1, wherein:
the first punch-through preventing ions are P-type ions including fluoride ions, or boron difluoride; and
the second punch-through preventing ions are N-type ions including arsenic ions.

3. The method of claim 1, wherein:
after performing the annealing process, a doping concentration of the first punch-through preventing ions in the first punch-through preventing layer is in a range from 1.0E18 atom/cm$^3$ to 5.0E19 atom/cm$^3$, and a doping concentration of the second punch-through preventing ions in the second punch-through preventing layer is in a range from 1.0E18 atom/cm$^3$ to 5.0E19 atom/cm$^3$.

4. The method of claim 1, further comprising:
after performing the annealing process, forming a first threshold voltage adjusting layer in the first fin portions, and a second threshold voltage adjusting layer in the second fin portions;
wherein the first threshold voltage adjusting layer is located just above the first punch-through preventing layer, the second threshold voltage adjusting layer is located just above the second punch-through preventing layer.

5. The method of claim 1, further comprising:
making the diffusion preventing ions enter the first punch-through preventing layer to prevent a diffusion of the first punch-through preventing ions;
wherein after performing the annealing process, a doping concentration of the diffusion ions in the first punch-through preventing layer is in a range from 1.0E19 atom/cm$^3$ to 5.0E20 atom/cm$^3$.

6. The method of claim 5, wherein the diffusion preventing ions include carbon ions and nitrogen ions, and are implanted into insulating structure in the NMOS region by using a composite ions implantation process.

7. The method of claim 5, wherein the diffusion preventing ions are implanted into insulating structure in the NMOS region by using a lateral straggle ion implantation process.

8. The method of claim 1, wherein forming the insulating structure comprises:
forming an insulating material layer, a top surface of the insulating layer is non-lower than the top surfaces of the fin portions; and
etching the insulating material layer to make the top surface of the insulating layer lower than the top surfaces of the fin portions to form the insulating structure.

9. The method of claim 8, wherein:
the insulating material layer is formed by using a flowable chemical vapor deposition process, including:
forming a precursor layer, a surface of the precursor layer is non-lower than the top surfaces of the fin portions; and
curing the precursor layer to form the insulating material layer by using a low-temperature annealing process, wherein a temperature of the low-temperature annealing process is in a range from 500° C. to 600° C., a duration time of the low-temperature annealing process is in a range from 20 minutes to 40 minutes.

10. A method for forming a semiconductor structure, comprising:
providing a substrate including an NMOS region and a PMOS region that are adjacent to each other;
implanting first punch-through preventing ions into the NMOS region of the substrate to form a first implantation layer;
etching the substrate to form a plurality of fin portions, including first fin portions in the NMOS region, and second fin portions in the PMOS region, wherein:
surfaces of the substrate between the first fin portions in the NMOS region are lower than the first implantation layer, and
the remaining first implantation layer in the first fin portions that is not etched forms a first punch-through preventing layer;
forming insulating structures between adjacent first fin portions and second fin portions, wherein surfaces of the insulating structure are higher than top surfaces of the first punch-through preventing layer;
after forming the insulating structures, implanting second punch-through preventing ions into the PMOS region of the substrate, and making the second punch-through preventing ions diffuse into the second fin portions to form a second punch-through preventing layer; and performing an annealing process to activate the first punch-through preventing layer and the second punch-through preventing layer.

11. The method of claim 10, wherein the second punch-through preventing ions are implanted into the PMOS region of the substrate by using a lateral straggle ion implantation process.

12. The method of claim 10, wherein:
the first punch-through preventing ions are P-type ions including fluoride ions, or boron difluoride; and
the second punch-through preventing ions are N-type ions including arsenic ions.

13. The method of claim 10, wherein:
after performing the annealing process, a doping concentration of the first punch-through preventing ions in the first punch-through preventing layer is in a range from $1.0E18$ atom/cm$^3$ to $5.0E19$ atom/cm$^3$, and a doping concentration of the second punch-through preventing ions in the second punch-through preventing layer is in a range from $1.0E18$ atom/cm$^3$ to $5.0E19$ atom/cm$^3$.

14. The method of claim 10, further comprising:
after performing the annealing process, forming a first threshold voltage adjusting layer in the first fin portions, and a second threshold voltage adjusting layer in the second fin portions;
wherein the first threshold voltage adjusting layer is located just above the first punch-through preventing layer, the second threshold voltage adjusting layer is located just above the second punch-through preventing layer.

15. The method of claim 10, further comprising:
after forming the insulating structure and before performing the annealing process, implanting diffusion preventing ions into insulating structure in the NMOS region, and making the diffusion preventing ions enter the first punch-through preventing layer to prevent a diffusion of the first punch-through preventing ions;
wherein after performing the annealing process, a doping concentration of the diffusion ions in the first punch-through preventing layer is in a range from $1.0E19$ atom/cm$^3$ to $5.0E20$ atom/cm$^3$.

16. The method of claim 15, wherein the diffusion preventing ions include carbon ions and nitrogen ions, and are implanted into insulating structure in the NMOS region by using a composite ions implantation process.

17. The method of claim 15, wherein the diffusion preventing ions are implanted into insulating structure in the NMOS region by using a lateral straggle ion implantation process.

18. The method of claim 10, wherein forming the insulating structure comprises:
forming an insulating material layer, a top surface of the insulating layer is non-lower than the top surfaces of the fin portions; and
etching the insulating material layer to make the top surface of the insulating layer lower than the top surfaces of the fin portions to form the insulating structure.

19. The method of claim 18, wherein:
the insulating material layer is formed by using a flowable chemical vapor deposition process, including:
forming a precursor layer, a surface of the precursor layer is non-lower than the top surfaces of the fin portions; and
curing the precursor layer to form the insulating material layer by using a low-temperature annealing process, wherein a temperature of the low-temperature annealing process is in a range from 500° C. to 600° C., a duration time of the low-temperature annealing process is in a range from 20 minutes to 40 minutes.

* * * * *